United States Patent

Hilbrink

[11] Patent Number: 5,563,619
[45] Date of Patent: Oct. 8, 1996

[54] LIQUID CRYSTAL DISPLAY WITH INTEGRATED ELECTRONICS

[75] Inventor: Johan O. Hilbrink, Blue Ash, Ohio

[73] Assignee: NCR Corporation, Dayton, Ohio

[21] Appl. No.: 415,140

[22] Filed: Mar. 29, 1995

Related U.S. Application Data

[63] Continuation of Ser. No. 34,990, Mar. 22, 1993, abandoned.

[51] Int. Cl.$^6$ .................................................. G09G 5/00
[52] U.S. Cl. ................... 345/4; 345/87; 345/104; 359/88
[58] Field of Search .................................. 345/4, 5, 104, 345/87; 361/398; 359/88; 174/254

[56] References Cited

U.S. PATENT DOCUMENTS

| | | | |
|---|---|---|---|
| 3,579,206 | 5/1971 | Grange | 174/254 |
| 3,705,310 | 12/1972 | Wild | 250/229 |
| 4,468,659 | 8/1984 | Ohba et al. | 340/719 |
| 4,521,775 | 6/1985 | Noble | 345/4 |
| 4,549,174 | 10/1985 | Funada et al. | 345/4 |
| 4,597,635 | 7/1986 | Hoshikawa | 350/334 |
| 4,655,551 | 4/1987 | Washizuka et al. | 359/88 |
| 4,690,510 | 9/1987 | Takamatsu et al. | 350/334 |
| 4,839,634 | 6/1989 | More et al. | 345/104 |
| 4,862,153 | 8/1989 | Nakatani et al. | 340/718 |
| 4,896,946 | 1/1990 | Suzuki et al. | 350/336 |
| 4,917,466 | 4/1990 | Nakamura et al. | 350/336 |
| 5,029,984 | 7/1991 | Adachi et al. | 350/334 |
| 5,140,107 | 8/1992 | Crooks et al. | 178/19 |

FOREIGN PATENT DOCUMENTS

| | | |
|---|---|---|
| 0539597 | 5/1993 | European Pat. Off. . |
| 3914527 | 8/1990 | Germany . |
| 57-205711 | 12/1982 | Japan . |
| 62-289815 | 12/1987 | Japan . |
| 2248926 | 10/1990 | Japan . |
| 5-825615 | 2/1993 | Japan . |
| WO9221051 | 11/1992 | WIPO . |

OTHER PUBLICATIONS

"IMS G 300 colour video controller", Inmos, pp. 73–79, Nov., 1988.

*Primary Examiner*—Richard Hjerpe
*Assistant Examiner*—Kent Chang
*Attorney, Agent, or Firm*—Paul W. Martin

[57] ABSTRACT

A liquid crystal display which has integrated electronics. The liquid crystal display includes a first liquid crystal plate member having a bottom surface and a plurality of substantially parallel conductors on the bottom surface, and a second liquid crystal plate member mounted below the first plate member and having a top surface and a plurality of substantially parallel conductors on the top surface. The conductors of the first plate member are substantially perpendicular to the conductors of the second plate member. A flexible member coupled to the liquid crystal display includes a circuit having a driver circuit which drives the first and second plate members to form the liquid crystal display. The circuit may also include at least one integrated circuit, as well as electrical traces which are coupled to conductors on the first and second plate members. The flexible member mounts on top of the first plate member and the exposed portions of the second plate member, and bends around the first plate member to contact the bottom surface of the first plate member at the first end.

13 Claims, 2 Drawing Sheets

LIQUID CRYSTAL DISPLAY WITH INTEGRATED ELECTRONICS

This is a continuation of application(s) Ser. No. 08/034,990 filed on Mar. 22, 1993, now abandoned.

BACKGROUND OF THE INVENTION

The present invention relates to liquid crystal displays, and more specifically to a liquid crystal display with integrated electronics.

Typically, liquid crystal glass screens for use in liquid crystal displays (LCDs) are manufactured as individual components, separate from the electronic circuits to which they are connected. The electronic circuits are generally part of a printed circuit board and may include circuitry for driving the liquid crystal glass screens, as well as a microprocessor. The electronic circuitry may be consolidated into as few separate components as possible, with the main processor and drive circuitry being located on a single chip. The liquid crystal glass screens are connected to the printed circuit board to form an LCD device. Disadvantageously, connection of the electronic circuits to the glass is difficult.

A detailed description of the construction of LCDs can be found in the text "Electronic Display Devices", by Shoichi Matsumoto, published by John Wiley & Sons. This book is hereby incorporated by reference.

Therefore, it would be desirable to provide a liquid crystal display which has integrated electronics and which does not include a rigid printed circuit board. It would also be desirable to provide an improved method for coupling liquid crystal glass screens with their associated electronic circuitry.

SUMMARY OF THE INVENTION

In accordance with the teachings of the present invention, a liquid crystal display with integrated electronics is provided. The liquid crystal display includes a first liquid crystal plate member having a top surface and a plurality of substantially parallel conductors on the top surface, and a second liquid crystal plate member mounted on top of the first plate member and having a bottom surface and a plurality of substantially parallel conductors on the bottom surface. The conductors of the first plate member are substantially perpendicular to the conductors of the second plate member. A flexible member coupled to the conductors of the first and second plate members includes a circuit having a driver circuit which drives the first and second liquid crystal plate members to form the liquid crystal display. The circuit includes electrical traces which are coupled to conductors on the first and second plate members. The circuit additionally includes at least one integrated circuit, which may include a microprocessor. The flexible member mounts on top of the second plate and the exposed portions of the first plate, and bends around the first plate to contact the bottom surface of the second plate at the first end.

It is accordingly an object of the present invention to provide a liquid crystal display which has integrated electronics.

It is another object of the present invention to provide a liquid crystal display which has integrated electronics for a complete data processing device.

It is another object of the present invention to provide a liquid crystal display which has integrated electronics but which does not include a rigid printed circuit board.

It is another object of the present invention to provide a method for making such a liquid crystal display having integrated electronics.

BRIEF DESCRIPTION OF THE DRAWINGS

Additional benefits and advantages of the present invention will become apparent to those skilled in the art to which this invention relates from the subsequent description of the preferred embodiments and the appended claims, taken in conjunction with the accompanying drawings, in which:

DETAILED DESCRIPTION OF THE PREFERRED EMBODIMENT

Figure 1:
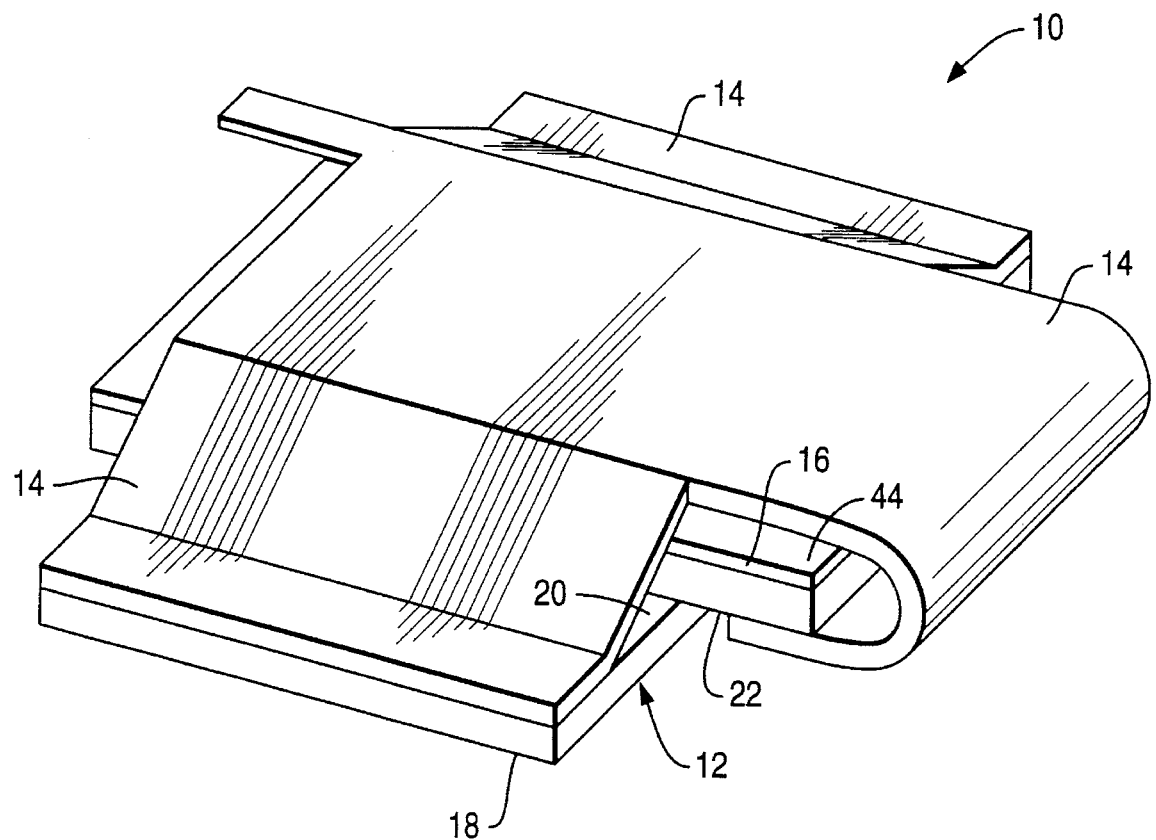
FIG. 1 is a perspective view of the liquid crystal display with integrated electronics of the present invention.

Referring now to FIG. 1, device 10 includes liquid crystal display (LCD) 12 and flexible electronic circuit assembly 14. LCD 12 includes upper and lower liquid crystal glass plates 16 and 18, which are hermetically sealed around their peripheries to enclose a cavity containing liquid crystal material. The liquid crystal material changes its light-polarizing behavior when a voltage is applied.

Flexible electronic circuit assembly 14 rests on top of both plates 16 and 18. It bends as necessary to contact top surface 20 of lower plate 18 and wraps around upper plate 16 to make contact with bottom surface 22. In the embodiment of FIG. 1, contact is made at opposite ends of lower plate 18, but only one end of upper plate 16. Another embodiment envisions contact being made at both ends of plate 16.

Figure 2:
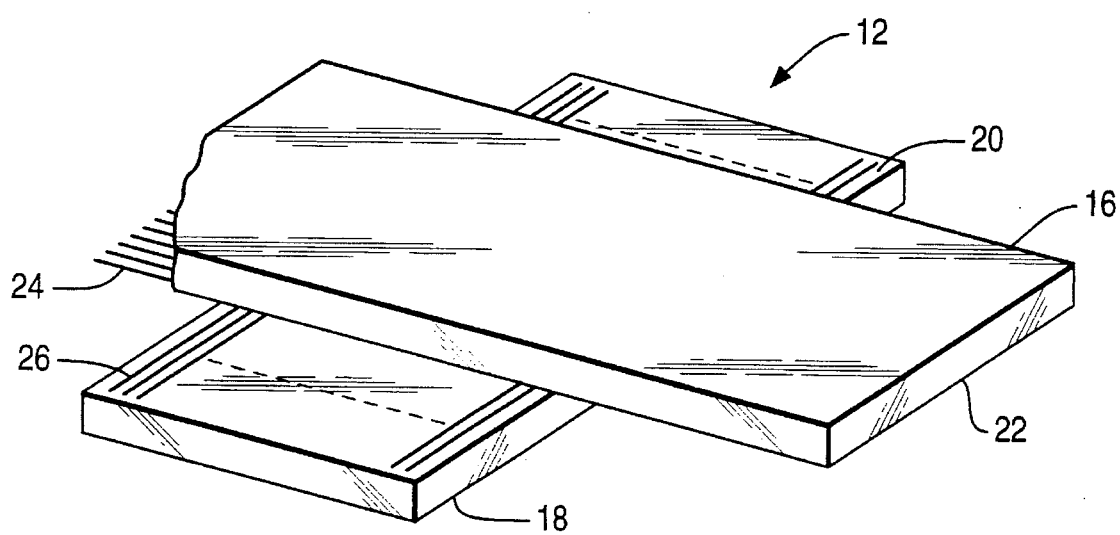
FIG. 2 is a perspective view of the liquid crystal display.

Referring now to FIG. 2, upper and lower glass plates 16 and 18 are shown in more detail. Plate 16 includes transparent conductors 24 on bottom surface 22, and plate 18 includes transparent conductors 26 on top surface 20. Transparent conductors 24 and 26 are usually made of indium-tin oxide. When a voltage is applied between a given one of conductors 24 and a given one of conductors 26, the light-polarizing behavior of the liquid crystal material causes incident light to be blocked, thereby creating the appearance of a dark spot where the conductors cross. It is common practice for high-resolution LCDs to interdigitate conductors 26 and to provide two points of contact, on opposite ends of plate 18, between integrated electronics assembly 14 and conductors 26. For such LCDs, the pitch of conductors 24 and 26 is typically six mils.

Figure 3:
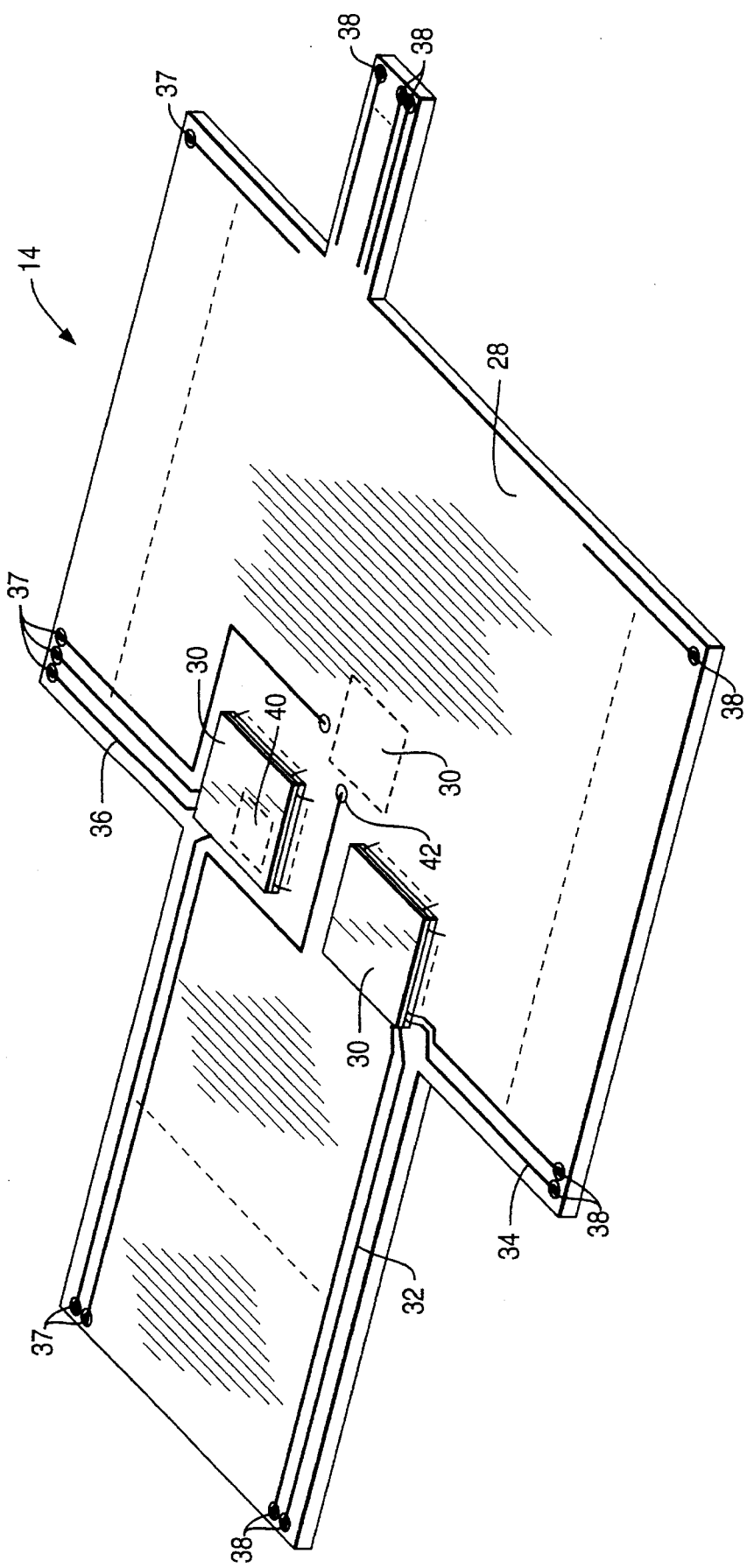
FIG. 3 is a perspective view of the integrated electronics.

Referring now to FIG. 3, integrated electronics assembly 14 primarily includes a flexible substrate 28 and integrated circuits (ICs) 30. Flexible substrate 28 may be any commercially-available high or low-temperature flexible substrate. The high-temperature flexible substrate is preferred if ICs 30 and other components are to be soldered to substrate 28. The low-temperature is preferred if ICs 30 and other components are to be glued to substrate 28 with a commercially-available conductive adhesive. Preferably, the thermal coefficient of expansion of substrate 28 is approximately the same as that of plate 16 and 18.

Substrate 28 includes electrical traces 32-38, wherein electrical traces 32 make contact with conductors 24, electrical traces 34 and 36 make contact with conductors 26 on opposite ends of glass plate 18, and electrical traces 38 make contact with other electronic components which may be part of the system containing device 10. Preferably, traces 32–36 are soldered with solder 37 or glued to their respective conductors 24 and 26 with a commercially-available anisotropic conductive adhesive 38. This type of adhesive is conductive in the direction perpendicular to both the traces and conductors, and not conductive in any other direction.

ICs 30 may be any commercially available integrated circuits. The ones shown are of the quad flat pack type. For computer applications, ICs 30 may contain as much computer circuitry as possible, including the main processor 40 and additional components as necessary to form a complete data processing device. ICs 30 may be located on either side or on both sides of flexible substrate 28. If ICs 30 are to be located on the side opposite to that of traces 32–38, care must be taken to minimize the occurrence of short circuits at vias 42 connecting traces on one side of flexible substrate 28 to the other.

Referring now to FIGS. 1–3, device 10 may be assembled by first aligning and bonding traces 32 to conductors 24. After these bonds are completed, flexible substrate 28 may be folded over upper glass plate 16. A compliant protective material 44 (FIG. 1) may be included between upper glass plate 16 and flexible substrate 28 to protect top surface of upper glass 16. After substrate 28 is folded, traces 34 and 36 are aligned and bonded to conductors 26 to complete the assembly process.

Although the present invention has been described with particular reference to certain preferred embodiments thereof, variations and modifications of the present invention can be effected within the spirit and scope of the following claims.

What is claimed is:

1. A modular display device comprising:

a first substantially rectangular liquid crystal plate member having a top surface and a plurality of substantially parallel conductors on the top surface, wherein the first plate member is hermetically sealed around its periphery to enclose a cavity containing liquid crystal material;

a second substantially rectangular liquid crystal plate member mounted on top of the first plate member and having a bottom surface and a plurality of substantially parallel conductors on the bottom surface, wherein the second plate member is hermetically sealed around its periphery to enclose a cavity containing liquid crystal material;

wherein the first and second plate members are arranged against each other so that the conductors of first plate member are adjacent and substantially perpendicular to the conductors of the second plate member:

wherein a portion of top surface of the first plate member is exposed at an end of the first plate member, and a portion of the bottom surface of the second plate member is exposed at an end of the second plate member; and a flexible member mounted generally on top of the second plate member and having a first side and including a circuit mounted to the first side which has a driver circuit which drives the first and second plate members to form a single liquid crystal display, a first connecting portion which wraps around the end of the second plate member to connect the driver circuit to the exposed portion of the bottom surface, a second connecting portion which connects the driver circuit to the exposed portion of the top surface, and a third connecting portion for coupling the modular display device within a system.

2. The device as recited in claim 1, wherein another portion of top surface of the first plate member is exposed at another end of the first plate member.

3. The device as recited in claim 1, wherein the circuit further comprises:

a single integrated circuit, including a microprocessor; and a plurality of electrical traces coupling the integrated circuit to the first and second plate members.

4. The device as recited in claim 1, wherein the circuit further comprises:

at least one electrical component; and a plurality of electrical traces coupling the electrical component to the first and second plate members.

5. The device as recited in claim 4, wherein the electrical component and the traces are located only on the first side of the flexible member.

6. The device as recited in claim 4, wherein the electrical traces are located on the first side and on a second side of the flexible member, wherein the flexible member has a via for each trace passing from one side of the flexible member to the other.

7. The device as recited in claim 4, wherein the electrical component comprises an integrated circuit.

8. The device as recited in claim 2, wherein the circuit comprises:

a first group of electrical traces, wherein each electrical trace of the first group is coupled to a conductor on the first plate member at the one end;

a second group of electrical traces, wherein each electrical trace of the second group is coupled to a conductor on the first plate member at the other end; and a third group of electrical traces, wherein each electrical trace of the third group is coupled to a conductor on the second plate member at the end of the second plate member.

9. The device as recited in claim 1, further comprising a protective member between the flexible member and the second plate member.

10. The device as recited in claim 6, wherein the electrical component is located on the second side of the flexible member.

11. The device as recited in claim 8, further comprising a conductive adhesive joining each electrical trace to its respective conductor.

12. The device as recited in claim 8, further comprising a solder joining each electrical trace to its respective conductor.

13. A method for producing a modular liquid crystal display device comprising the steps of:

providing only first and second substantially rectangular liquid crystal plate members having first and second ends and top and bottom surfaces, the first plate member including a plurality of parallel conductors on its top surface and the second plate member including a plurality of parallel conductors on its bottom surface, wherein the first and second plate members are hermetically sealed around their peripheries to enclose first and second cavities containing liquid crystal material;

coupling the top surface of the first plate member to the bottom surface of the second plate member such that the conductors of the first plate member are substantially perpendicular to the conductors of the second plate member, a portion of top surface of the first plate member is exposed at an end of the first plate member, and a portion of the bottom surface of the second plate member is exposed at an end of the second plate member;

providing a flexible circuit member on top of the second plate member including the components of a complete data processing device, having at least one integrated circuit component, a plurality of electrical traces coupled to the integrated circuit component, a first connecting portion, a second connecting portion, and a third connecting portion for coupling the modular display device within a system;

bending said first connecting portion to enable it to engage the conductors of the end of the first plate members;

bending said second connecting portion around the end of the second plate member to enable it to engage the conductors of the end of the second plate member; and gluing the electrical traces to the conductors of the end of the second plate member and to the conductors of the end of the first plate member.

* * * * *

UNITED STATES PATENT AND TRADEMARK OFFICE
CERTIFICATE OF CORRECTION

PATENT NO.    : 5,563,619
DATED         : October 8, 1996
INVENTOR(S)   : Johan O. Hilbrink It is certified that error appears in the above-indentified patent and that said Letters Patent is hereby corrected as shown below:

Column 6, line 3, delete "members" and substitute --member--.

Signed and Sealed this

Thirtieth Day of December, 1997

Attest:

BRUCE LEHMAN

Attesting Officer

Commissioner of Patents and Trademarks